(12) United States Patent
Colvin

(10) Patent No.: US 7,323,888 B1
(45) Date of Patent: Jan. 29, 2008

(54) SYSTEM AND METHOD FOR USE IN FUNCTIONAL FAILURE ANALYSIS BY INDUCED STIMULUS

(76) Inventor: James B. Colvin, 36217 Worthing Dr., Newark, CA (US) 94560

( * ) Notice: Subject to any disclaimer, the term of this patent is extended or adjusted under 35 U.S.C. 154(b) by 0 days.

(21) Appl. No.: 10/967,808

(22) Filed: Oct. 18, 2004

Related U.S. Application Data

(60) Provisional application No. 60/516,493, filed on Nov. 1, 2003.

(51) Int. Cl.
  *G01R 31/302* (2006.01)
  *G01R 31/305* (2006.01)
(52) U.S. Cl. .................. 324/751; 250/310; 324/752
(58) Field of Classification Search ............... None
  See application file for complete search history.

(56) References Cited

U.S. PATENT DOCUMENTS

| | | | | |
|---|---|---|---|---|
| 5,105,147 A | * | 4/1992 | Karasikov et al. | 324/537 |
| 5,453,703 A | * | 9/1995 | Goldfarb | 324/765 |
| 5,465,046 A | * | 11/1995 | Campbell et al. | 324/244 |
| 5,519,334 A | * | 5/1996 | Dawson | 324/765 |
| 5,661,408 A | * | 8/1997 | Kamieniecki et al. | 324/765 |
| 6,084,419 A | * | 7/2000 | Sato et al. | 324/754 |
| 6,501,288 B1 | * | 12/2002 | Wilsher | 324/753 |
| 6,630,832 B1 | * | 10/2003 | Harzanu et al. | 324/537 |

OTHER PUBLICATIONS

Colvin, J.; "Functional Failure Analysis by Induced Stimulation"; Proc. of the Int. Symp. Test and Failure Analysis (ISTFA); 2002; pp. 623-630.*

* cited by examiner

*Primary Examiner*—Ernest Karlsen
(74) *Attorney, Agent, or Firm*—Danamraj & Emanuelson, P.C.

(57) ABSTRACT

A scanning/imaging system wherein an external stimulus is used for exciting a device under test (DUT). A stimulus source is included for providing a stationary stimulus with a controllable spot size to a device under test (DUT), the controllable spot size covering a portion of the DUT for excitation by the stationary stimulus. A sensor is operable for capturing at least one of a functional response signal and an optical image signal emanating from the DUT portion. A linear positioning device is operable to facilitate scanning of remaining portions of the DUT until a predetermined area thereof has been traversed. A controller is operably coupled to the linear positioning device, stimulus source and the sensor for providing the overall control thereof.

28 Claims, 2 Drawing Sheets

SYSTEM AND METHOD FOR USE IN FUNCTIONAL FAILURE ANALYSIS BY INDUCED STIMULUS

PRIORITY UNDER 35 U.S.C. §119(e) & 37 C.F.R. §1.78

This nonprovisional application claims priority based upon the following prior United States provisional patent application entitled: "FUNCTIONAL FAILURE ANALYSIS BY INDUCED STIMULUS," Application No. 60/516,493, filed Nov. 1, 2003, in the name(s) of James Barry Colvin; which is hereby incorporated by reference in its entirety for all purposes.

BACKGROUND OF THE INVENTION

1. Technical Field of the Invention

The present invention generally relates to scanning and imaging techniques in failure analysis of electronic devices such as semiconductor integrated circuits, packages, boards, and the like. More particularly, and not by way of any limitation, the present invention is directed to a system and method for isolating failures in electronic devices using stimulus-induced fault testing (SIFT).

2. Description of Related Art

In the field of failure analysis of integrated circuits, isolating and diagnosing functional failures is a cardinal requirement. Traditional beam-based analytical techniques use a scanning laser or electron beam (e-beam) to induce a parametric shift, which is monitored through changes in current or voltage driven to the device. Deep submicron technologies and complex, multi-layered architectures prevalent today frustrate these analytical methods due to the nearly immeasurable parametric shifts externally caused by a small internal leakage path. Although these failures can sometimes be identified functionally by timing, temperature, or voltage dependencies, even the proximate location of the fault is difficult to isolate. Relatedly, field of view limitations inherent in today's beam-based techniques compound the difficulty due to the fact that a huge number of scans need to performed to cover a large die, resulting in an enormous amount of test points that require an inordinate period of time for completing the analysis.

SUMMARY OF THE INVENTION

In general, the present invention involves intentionally disturbing electronic devices, parts, boards, etc. with an external stimulus source and comparing the test criteria to reference parts or timing/voltage sensitivities. In one aspect, the present invention is directed to a method that comprises the following operations: applying a stationary stimulus with a controllable spot size to a device under test (DUT), the controllable spot size covering a portion of the DUT for excitation by the stationary stimulus; capturing at least one of a functional response signal and an optical image signal emanating from the portion of the DUT; and scanning remaining portions of the DUT until a predetermined area thereof has been traversed.

In another aspect, the present invention is directed to an apparatus, comprising: a stimulus source for providing a stationary stimulus with a controllable spot size to a device under test (DUT), the controllable spot size covering a portion of the DUT for excitation by the stationary stimulus; a sensor for capturing at least one of a functional response signal and an optical image signal emanating from the portion of the DUT; a linear positioning device operable to facilitate scanning of remaining portions of the DUT until a predetermined area thereof has been traversed; and a controller operably coupled to the linear positioning device, the stimulus source and the sensor for providing overall control thereof.

In a further embodiment, the present invention is directed to a system, comprising: means for applying a stationary stimulus with a controllable spot size to a device under test (DUT), the controllable spot size covering a portion of the DUT for excitation by the stationary stimulus; means for capturing at least one of a functional response signal and an optical image signal emanating from the portion of the DUT; and means for scanning remaining portions of the DUT until a predetermined area thereof has been traversed.

BRIEF DESCRIPTION OF THE DRAWINGS

The accompanying drawings are incorporated into and form a part of the specification to illustrate one or more presently preferred exemplary embodiments of the present invention. Various advantages and features of the invention will be understood from the following Detailed Description taken in connection with the appended claims and with reference to the attached drawing figures in which:

DETAILED DESCRIPTION OF THE DRAWINGS

Figure 1:
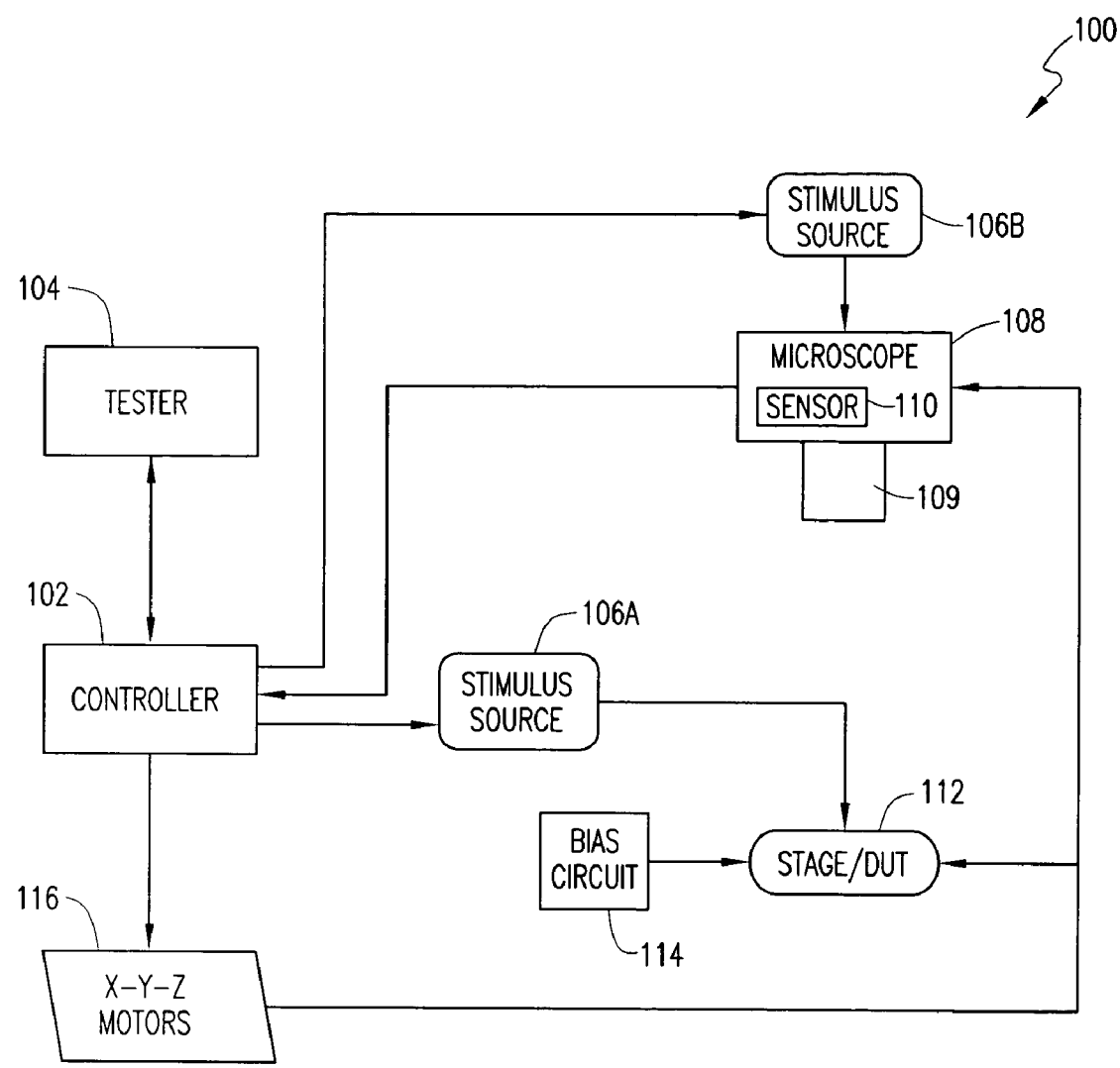
FIG. 1 depicts a block diagram of an exemplary scanning system embodiment operable for fault isolation in accordance with the teachings of the present invention.

Embodiments of the invention will now be described with reference to various examples of how the invention can best be made and used. Like reference numerals are used throughout the description and several views of the drawings to indicate like or corresponding parts, wherein the various elements are not necessarily drawn to scale. Referring now to the drawings, and more particularly to FIG. 1, depicted therein is a block diagram of an exemplary scanning system or apparatus 100 operable for fault isolation and image generation in accordance with an embodiment of the present invention. As illustrated, the system 100 may be based on either a motorized probe station or a microscope stand for test head applications, although other configurations are possible. One or more external stimulus sources 106A, 106B are operated under control of a controller unit 102 for applying a stationary stimulus with a controllable spot size to a device under test (DUT) positioned on a stage, collectively referred to by reference numeral 112. As will be described in additional detail hereinbelow, the stimuli can be a variety of electromagnetic, electrostatic, magnetic, acoustic or radio frequency (RF) signals, optical or electron beams, etc. that are capable of exciting a portion of the DUT covered by the variable spot size. Since the scanning system 100 uses a stationary or fixed stimulus with an arbitrary spot size and is not dependent on traditional microscope optics for generating a highly focused beam (e.g., having a diameter of one or several microns depending on the diffraction characteristics of the optical elements used) that is conventionally rastered across a limited field of view, the scan area of the present invention can be variable as well as relatively quite large, ranging from a few microns to 12 inches or more. Accordingly, the present invention allows for scanning of a diverse array of electronic devices, such as individual dies, packages, wafers, whole boards, etc., for fault isolation and/or imaging purposes. Where the scanning system 100 is deployed in a fault isolation application, the scanning system 100 may be termed as the stimulus-induced fault testing (SIFT) scanner for purposes of the present patent application.

In one embodiment, stimulus source 106A is operable to provide a suitable stimulus that is directly applied within the proximity of the stage/DUT 112 for excitation of the DUT structures, e.g., as a probe tip that fixedly hovers over the surface of the DUT. In another embodiment, stimulus source 106B is coupled to a microscope head 108 whereby the stimulus is directed via an objective piece 109 towards the stage/DUT assembly 112. In either implementation, a biasing circuit 114 may used for properly biasing the DUT depending upon the applied stimuli and type of DUT as well as the particular failure analysis technique in which the scanning system is put to use.

Those skilled in the art should appreciate that various DUT structures such as p/n and n/p junctions, p-wells and n-wells, oxide layers, diffusion areas, contacts, inter-level vias, metal conductors and interconnects, and nodes associated with active devices such as transistors, diodes, and so on, are operable to emanate characteristic response signals upon excitation by the applied stimuli, which can be captured by appropriate sensor(s) 110. Again, depending on the applied stimuli and the DUT type, sensors can be magnetoresistive, optical, RF, or thermal sensing elements that can provide appropriate data to the controller 102. A tester 104 with any type of user interface is coupled to the controller 102 for generating test vectors, patterns, conditions, etc. relative to the DUT being analyzed. The data output can be pass/fail data as well as analog data that may be converted to any n-bit digital data or vice versa. In addition, although not shown in FIG. 1, it should recognized that other equipment such as curve tracers, parametric analyzers, charge-coupled device (CCD) cameras, liquid crystal display (LCD) monitors, electronic components like signal analyzers, amplifiers, and the like may also be deployed in association with the tester 104 of the scanning/imaging system 100.

Because the applied stimulus is a stationary stimulus, either the stage/DUT assembly 112 or the microscope head 108 is moved in the X-Y plane in a raster scan pattern so as to traverse the desired DUT area. Also, either the stage/DUT assembly 112 or the microscope head 108 is capable of moving in the Z-direction in order to control the spot size of the applied stimulus by either focal control of the microscope optics or proximity control of the stimulus source. When a laser-based scanning application is desired, any suitable laser (e.g., a 670 nm laser diode) that is compatible with the selected optics is attached to the top camera port of the microscope head 108. The selected objective, aperture, as well as related focal control contribute to the regulation of the spot size in this embodiment. Alternatively, where the fixed stimulus is introduced over the DUT with the raster control being applied to the stage, the Z-control determines the spot size. As alluded to before, this scanning method embodiment may be thought of in the same way a probe is positioned over the DUT by moving the stage, and may be termed the scanned probe method. It should be appreciated by those skilled in the art that the scanned probe method allows coupling of a scanning tip to the device being tested, wherein electrostatic/capacitive coupling of the tip the device is useful for localizing floating nodes on an integrated circuit or for mapping active circuit paths electrostatically or magnetically.

Continuing to refer to FIG. 1, controller 102 may be embodied as a microcontroller or a processor-based system that is responsible for X-Y-Z positioning, stimulus source control, analog or digital signal capture from the stage/DUT 112 or tester 104 where applicable, and communicates with the tester 104 for handshaking. Communication can be one-sided, i.e., where the controller 102 will provide a position control signal only after receiving a pass/fail signal from the tester 104. On the other hand, bi-directional communication involves ready to step and ready for next loop handshake signaling between the tester 104 and the controller 102. Irrespective of the type of communication, the scan and step is preferably user-defined based on the desired spot size.

The X-Y-Z movement is effectuated by suitable motors 116 comprising stepper motors, servo motors or similar linear positioning devices operating under the control of controller 102. Since the DUT is scanned in X- and Y-directions based on coordinate data, a computer-aided design (CAD) layout database of the DUT may be appropriately interfaced with the scanning system 100 for matching scan position control with the DUT's design database itself. Accordingly, no optical imaging is absolutely necessary in order to ascertain where on the device the scanning is being done.

Figure 2:
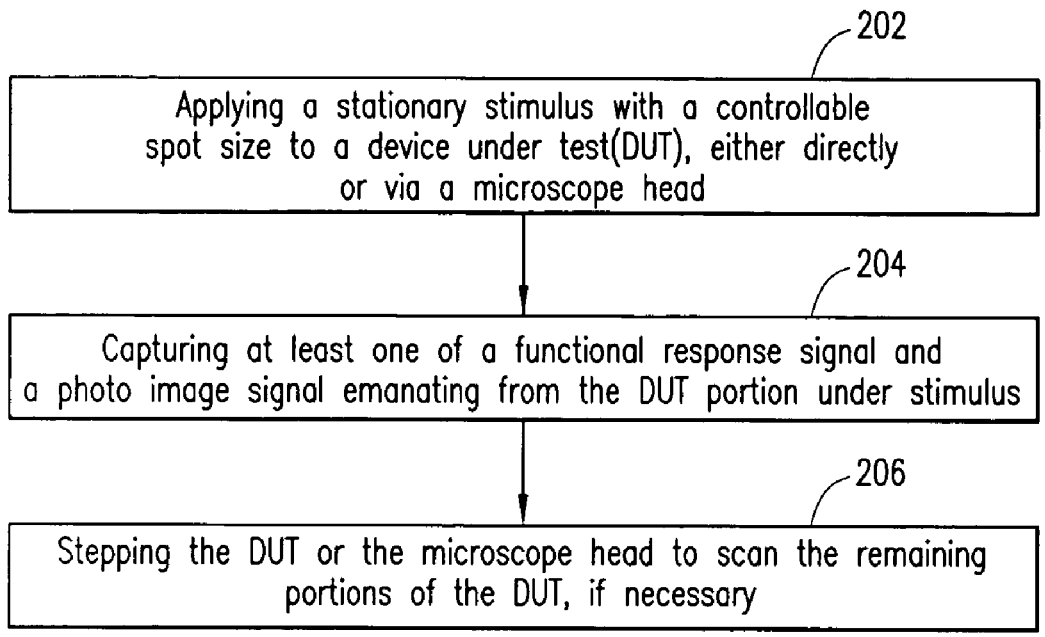
FIG. 2 is flow chart of an exemplary scanning method operable for fault isolation in accordance with the teachings of the present invention.

FIG. 2 is flow chart of an exemplary scanning method operable for fault isolation or device imaging in accordance with an aspect of the present invention. A stationary stimulus is applied with a controllable spot size to a DUT, either directly or via a microscope head (block 202). As described above, the controllable spot size is controlled in one embodiment by moving the DUT's stage in a vertical direction (i.e., Z-direction). In another embodiment, the spot size is regulated by varying focal control associated with the microscope head to which a stimulus source is coupled. Also, the microscope head itself may be moved in the Z-direction to vary the spot size by defocusing. The stationary stimulus is operable to excite the area or portion of the DUT covered by the spot size such that response signals emanate therefrom. Using appropriate sensor arrangements, the response signals may be captured for further processing (block 204). The response signals can include a photo image signal, a functional response signal, or both, that emanate from the DUT portion under stimulus. The remaining portions of the DUT may be scanned, if necessary, by stepping the DUT's stage or the microscope head (block 206). Accordingly, the scan and step operations may iteratively continue until the entire area of the DUT has been traversed (e.g., for obtaining a photo image of a large die). On the other hand, the scan and step operations may continue until a predetermined area of the DUT has been scanned, e.g., a decoder block or input/output block of a semiconductor memory.

Those skilled in the art should recognize that the scanning/imaging technique described above is not only elegant in its simplicity, but affords a substantial degree of versatility as well. Because a diverse array of stimulus sources can be accommodated within the scope of the present invention, the scanning system 100 may be deployed in numerous functional modes. Some of the exemplary functional modes of the scanning system of the present invention are set forth immediately hereinbelow.

A. High Frequency Magnetic Induction: By placing a miniature induction coil over the DUT and scanning in accordance with the teachings herein, package level shorts can be mapped. Based on the frequency used (10 MHz to 20 MHz, for example), a spatial resolution of about 2 mm may be achieved. Magnetic induction couples to and heats directly the conductors embedded in a package, whereby parametric shifts of the leakage are monitored during the scanning process in relation to the coordinates of the package floor plan. Also, mutual coupling of the magnetic field can be used to map conductor location.

B. Magnetic Current Mapping: By positioning a miniature magnetoresistive sensor within the scanner apparatus, any or all axes (X, Y, and Z) of the magnetic field across a DUT can be mapped. This is particularly useful for identifying current flow in the DUT. Abnormal or normal paths can be mapped in the microamp (>A) level, allowing tracing and debug of the DUT. In this functional mode, resolution is impacted primarily by tip proximity and field strength.

C. RF Scan: In this mode, an RF probe tip is employed to inject or receive RF energy over the DUT. This technique is advantageous for tracing circuit paths carrying their characteristic frequency, and may be applied at both die level and package level. Opens can be identified by assuming that the capacitive coupling across an open is not dominant. Again, spatial resolution is impacted primarily by proximity of the DUT to the tip source.

D. Functional SIFT: In this mode, pass/fail data from the tester is used in conjunction with the stepped or rastered stage/DUT in order to generate a physical map of pass/fail data.

E. Electrostatic SIFT: An AC field is coupled to the device wherein the conductor lines act as a stimulus source.

F. Thermal SIFT: Thermal stimulus is useful for localizing ohmic shorts or intermittent connections as well as timing related failures. This mode involves thermally exciting a localized area of the DUT while scanning it. Both ohmic Electrostatic Discharge (ESD) or Vdd failures are also suitable candidates for this technique, which may be based on the following stimulus sources: (i) scanning hot probe tips, (ii) thermal lasers at appropriate wavelengths, and (iii) magnetic induction heating elements.

Furthermore, there exist many different ways to electrically bias a DUT for beam-based measurements, and all are compatible with the teachings of the present invention. Thus, known failure analysis techniques such as Light Induced Voltage Alteration (LIVA), Optical Beam Induced Current (OBIC) imaging, Thermally Induced Voltage Alteration (TIVA), Externally Induced Voltage Alteration (XIVA), Charge Induced Voltage Alteration (CIVA), Optical Beam Induced Resistance Change (OBIRCH), etc., for example, may be advantageously practiced in conjunction with the scanning/imaging technique of the present invention for quicker fault isolation/localization and subsequent fine-grained beam raster scan of the site for further analysis.

Figure 3:
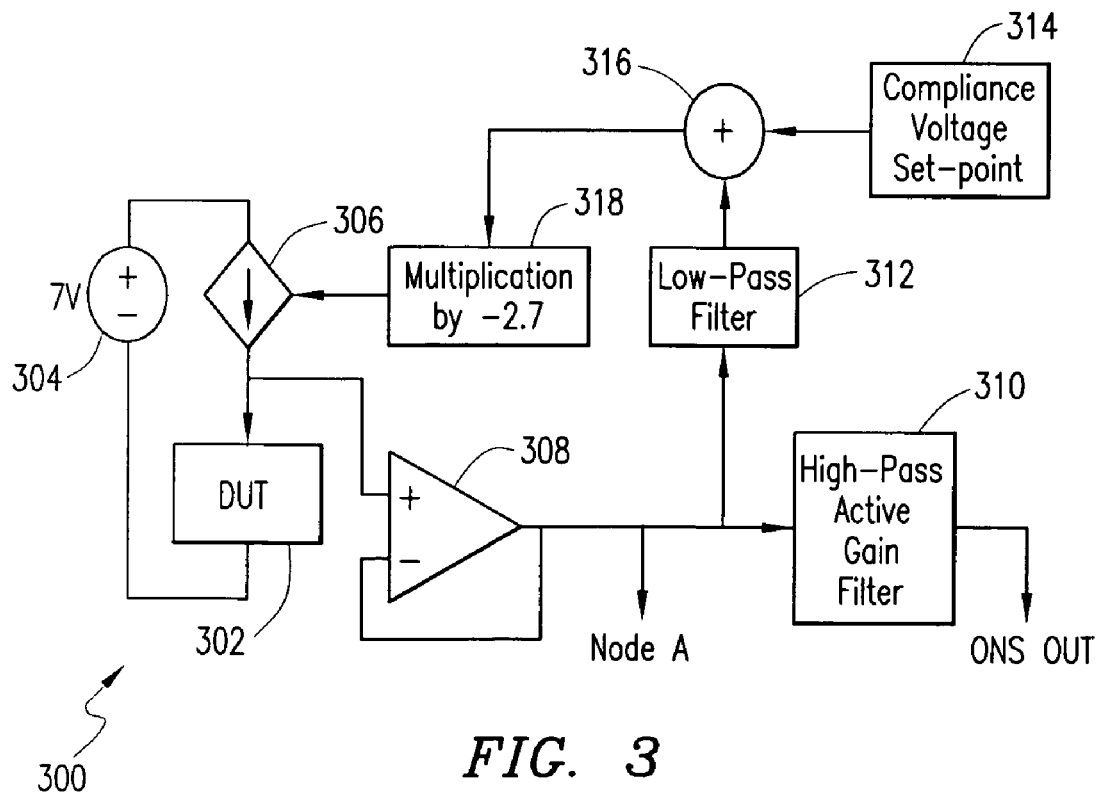
FIG. 3 depicts an exemplary biasing circuit for use with the embodiment shown in FIG. 1.

FIG. 3 depicts an exemplary biasing circuit 300 for use with the scanner embodiment shown in FIG. 1. As illustrated, the biasing circuit 300 is operable for supplying constant current type performance with constant voltage control. A voltage supply 304 is coupled to a current source 306 for driving a constant current across a DUT 302. A buffering stage 308 is used for buffering the resultant voltage drop across DUT 302 at node A that is coupled to a low-pass filter 312. The DC value of the DUT bias is supplied by the low-pass filter 312 to a summing circuit 316 which adds the negative desired set-point of the DUT (compliance voltage set-point) to the actual measured DUT bias. The output from the summer 316 is multiplied by a predetermined value, e.g., −2.7, by a multiplier 318, that controls the current source 306 such that Vcc is maintained on the DUT. The signal at node A is also supplied to a high-pass active gain filter 310 for detection of an oxide noise signature (ONS) signal, which is monitored during a SIFT scan to identify minute shifts in operation during a scan.

Based on the foregoing Detailed Description, it should be appreciated that the present invention advantageously provides a versatile scanning apparatus and method that could be utilized in fault isolation applications in performing failure analysis or simply in imaging large-scale circuitry. By employing SIFT, a number of external stimuli can be used to identify speed, fault, and parametric differences in silicon. Several benefits of the present invention are readily apparent: (i) large area scans beyond the limits of the field of view of the microscope are feasible; (ii) scan speed is controllable both by stepper/servo motor speed and test time/loop; (iii) ability to set the spot size at a relatively larger size, thereby allowing rapid and/or fewer scans of a device; (iv) galvo scanner drift generally present in conventional laser scan microscopes is eliminated, whereby accurate step and hold operations are possible; (v) mechanical motor control is compatible with microstepping and servo positioning methods; (vi) enabling of conventional laser-based scan methods (e.g., OBIC) to analyze the entire die or large areas of a device; (vii) remote optical coupling to tester or test equipment display monitors; and (viii) ability to generate 3D magnetic current maps of boards, packages, or dies using magnetoresistive sensors.

Although the invention has been described with reference to certain exemplary embodiments, it is to be understood that the forms of the invention shown and described are to be treated as exemplary embodiments only. Accordingly, various changes, substitutions and modifications can be realized without departing from the spirit and scope of the invention as defined by the appended claims.

What is claimed is:

1. An apparatus, comprising:
   a stimulus source for providing a stationary stimulus with a controllable spot size to a device under test (DUT) said controllable spot size covering a portion of said DUT for excitation by said stationary stimulus;
   a sensor for capturing at least one of a functional response signal and an optical image signal emanating from said portion of said DUT;
   a linear positioning device operable to facilitate scanning of said DUT; and
   a controller operably coupled to said linear positioning device, said stimulus source and said sensor for providing overall control thereof.

2. The apparatus as recited in claim 1, wherein said linear positioning device comprises a servo motor operable to move said DUT's stage in at least one of three dimensions.

3. The apparatus as recited in claim 1, wherein said linear positioning device comprises a stepper motor operable to move said DUT's stage in at least one of three dimensions.

4. The apparatus as recited in claim 1, wherein said linear positioning device comprises a servo motor operable to move a microscope head to which a stimulus source is coupled in at least one of three dimensions.

5. The apparatus as recited in claim 1, wherein said linear positioning device comprises a stepper motor operable to move a microscope head to which a stimulus source is coupled in at least one of three dimensions.

6. The apparatus as recited in claim 1, wherein said controllable spot size is controlled by moving said OUT's stage in a vertical direction.

7. The apparatus as recited in claim 1, wherein said controllable spot size is regulated by varying focal control associated with a microscope head to which a stimulus source is coupled.

8. The apparatus as recited in claim 1, wherein said stimulus source comprises a laser beam source.

9. The apparatus as recited in claim 1, wherein said stimulus source comprises an electron beam source.

10. The apparatus as recited in claim 1, wherein said stimulus source comprises a high frequency magnetic induction field source.

11. The apparatus as recited in claim 1, wherein said stimulus source comprises a thermal field source.

12. The apparatus as recited in claim 1, wherein said stimulus source comprises an electrostatic field source.

13. The apparatus as recited in claim 1, wherein said stimulus source comprises a radio frequency (RF) field source.

14. The apparatus as recited in claim 1, wherein said stimulus source comprises a magnetic field source.

15. A system, comprising:
    means for applying a stationary stimulus with a controllable spot size to a device under test (DUT), said controllable spot size covering a portion of said DUT for excitation by said stationary stimulus;
    means for capturing at least one of a functional response signal and an optical image signal emanating from said portion of said DUT; and
    means for scanning said DUT.

16. The system as recited in claim 15, wherein said means for scanning remaining portions of said DUT comprises means for moving on an X-Y plane at least one of said DUT's stage and a microscope head to which a stimulus source is coupled.

17. The system as recited in claim 16, wherein said means for moving comprises a servo motor.

18. The system as recited in claim 16, wherein said means for moving comprises a stepper motor.

19. The system as recited in claim 16, wherein said means for moving comprises a linear positioning device.

20. The system as recited in claim 15, wherein said controllable spot size is controlled by moving said OUT's stage in a vertical direction.

21. The system as recited in claim 15, wherein said controllable spot size is regulated by varying focal control associated with a microscope head to which a stimulus source is coupled.

22. The system as recited in claim 15, wherein said stationary stimulus comprises a laser beam.

23. The system as recited in claim 15, wherein said stationary stimulus comprises an electron beam.

24. The system as recited in claim 15, wherein said stationary stimulus comprises a high frequency magnetic induction field.

25. The system as recited in claim 15, wherein said stationary stimulus comprises a thermal field.

26. The system as recited in claim 15, wherein said stationary stimulus comprises an electrostatic field.

27. The system as recited in claim 15, wherein said stationary stimulus comprises a radio frequency (RF) field.

28. The system as recited in claim 15, wherein said stationary stimulus comprises a magnetic field.

* * * * *